United States Patent
Barth

(10) Patent No.: US 8,592,987 B2
(45) Date of Patent: Nov. 26, 2013

(54) SEMICONDUCTOR ELEMENT COMPRISING A SUPPORTING STRUCTURE AND PRODUCTION METHOD

(75) Inventor: Hans-Joachim Barth, Munich (DE)

(73) Assignee: Infineon Technologies AG, Neubiberg (DE)

( * ) Notice: Subject to any disclaimer, the term of this patent is extended or adjusted under 35 U.S.C. 154(b) by 380 days.

(21) Appl. No.: 11/862,211

(22) Filed: Sep. 27, 2007

(65) Prior Publication Data
US 2008/0079168 A1 Apr. 3, 2008

(30) Foreign Application Priority Data
Sep. 29, 2006 (DE) .......................... 10 2006 046 182

(51) Int. Cl.
*H01L 23/48* (2006.01)

(52) U.S. Cl.
USPC ...... 257/773; 257/758; 257/774; 257/E23.02; 438/618

(58) Field of Classification Search
USPC ............ 257/700–773, 781, E21.015, E21.02, 257/E23.02; 428/612; 438/618
See application file for complete search history.

(56) References Cited

U.S. PATENT DOCUMENTS

| 6,291,331 | B1* | 9/2001 | Wang et al. .................... 438/618 |
|---|---|---|---|
| 6,448,641 | B2* | 9/2002 | Ker et al. ........................ 257/700 |
| 6,625,882 | B1* | 9/2003 | Saran et al. ...................... 29/843 |
| 6,822,329 | B2* | 11/2004 | Varrot et al. ................... 257/781 |
| 6,908,841 | B2* | 6/2005 | Burrell et al. ................. 438/612 |
| 2002/0043727 | A1 | 4/2002 | Wu |
| 2005/0028126 | A1* | 2/2005 | Kan et al. .......................... 716/17 |
| 2006/0006547 | A1* | 1/2006 | Matsunaga .................... 257/774 |
| 2006/0065969 | A1* | 3/2006 | Antol et al. .................... 257/700 |
| 2006/0103031 | A1* | 5/2006 | Wu ................................ 257/781 |
| 2006/0289997 | A1* | 12/2006 | Tomita .......................... 257/758 |

FOREIGN PATENT DOCUMENTS

DE 10342996 A1 4/2005

* cited by examiner

*Primary Examiner* — Eugene Lee
*Assistant Examiner* — Fang-Xing Jiang
(74) *Attorney, Agent, or Firm* — Infineon Technologies AG; Philip H. Schlazer

(57) ABSTRACT

One or more embodiments are related to a semiconductor component comprising a supporting structure arranged in a first layer sequence, a second layer arranged above the first layer sequence, and a bonding pad. The layer sequence may comprise a plurality of layers of a dielectric and the bonding pad is arranged above the second layer. The supporting structure may comprise a plurality of supporting substructures and is formed under partial regions of the bonding pad.

10 Claims, 5 Drawing Sheets

SEMICONDUCTOR ELEMENT COMPRISING A SUPPORTING STRUCTURE AND PRODUCTION METHOD

RELATED APPLICATION INFORMATION

This application claims priority to German Application Number 10 2006 046 182.7, filed on Sep. 29, 2006. German Application Number 10 2006 046 182.7 is hereby incorporated by reference herein in its entirely.

FIELD OF THE INVENTION

Generally, the present invention related to semiconductor devices. In particular, the present invention relates to a semiconductor element comprising a supporting structure and to a method for producing a supporting structure.

BACKGROUND OF THE INVENTION

Semiconductor elements are used in integrated circuits for a multiplicity of electronic applications and devices, such as e.g. television, radio or telephone. In this case, the trend in the electronics industry is towards miniaturization of the electronic components.

DETAILED DESCRIPTION OF THE INVENTION

Figure 1:
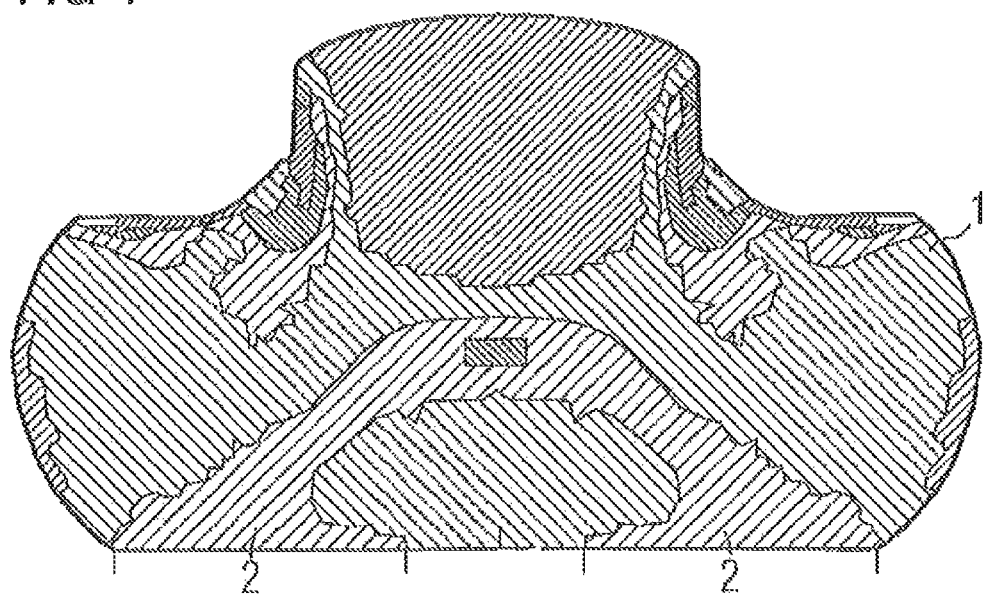
FIG. 1 shows a schematic illustration of the mechanical loadings of a bond during the bonding process in a sectional view.

Integrated circuits comprise, inter alia, a multiplicity of metallization levels and dielectric layers in which the interconnects are formed. In the past the dielectric layers were preferably formed from silicon dioxide. Nowadays, with increasing miniaturization, so-called low-k dielectrics are increasingly being used. The latter are understood to be dielectrics having a dielectric constant lower than that of silicon dioxide. Low-k materials enable short RC times in the interconnect sections. At the same time low-k materials have only a low mechanical stability and a low modulus of elasticity.

For electrically connecting the integrated circuit to the surrounding housing, contact areas, so-called bonding pads, are provided on the chip. A wire is fixedly bonded on them in a bonding process. The bonding process is a connecting technique in which the wire is permanently connected to the bonding pad under pressure, heat and ultrasound. Typical bonding methods are thermocompression bonding, thermosonic ball-wedge bonding and ultrasonic wedge-wedge bonding, for example. The bonding of bonding pads to underlying low-k materials is difficult. During the bonding process, the underlying material is exposed to a mechanical loading whose magnitude depends on the parameters of the bonding process. Low-k dielectrics, on account of their material properties, are in principle not very well suited to withstanding these mechanical loadings; this can result in damage in the semiconductor element through to the failure of the integrated circuit. Therefore, supporting structures that are intended to prevent damage during the bonding process are often formed under the bonding pads. U.S. Pat. No. 6,908,841 discloses supporting layers formed in parallel interconnect sections under the entire bonding pad.

An embodiment of the present invention is a semiconductor element comprising a supporting structure arranged in a first layer sequence of a semiconductor element, the layer sequence comprising a plurality of layers of a dielectric; comprising a second layer arranged above the first layer sequence; a bonding pad arranged above the second layer, the supporting structure comprising a plurality of supporting substructures and being arranged under partial regions of the bonding pad.

Another embodiment of the invention is a method for producing a semiconductor component comprising the steps of: forming a first layer stack on a semiconductor substrate, the layer stack comprising a plurality of layers of a dielectric, forming a second layer above the first layer stack, forming a bonding pad above the second layer, forming a supporting structure under partial regions of the bonding pad, the supporting structure being formed within the first layer stack and comprising a plurality of interconnect sections.

In one or more embodiments, the supporting structure may be formed only under partial regions and not under the entire bonding pad.

In one or more embodiments, the supporting structure may be formed in such a way that an inner or outer region without supporting function remains below the bonding pad.

In one or more embodiments, the supporting substructures may be arranged in circular fashion under the bonding pad.

In accordance with one embodiment of the invention, an interconnect is arranged between two adjacent supporting substructures, the said interconnect being in particular a functional interconnect.

The supporting substructures are preferably realized in the form of interconnect sections which are arranged in adjacent dielectric layers of the first layer sequence and are connected to one another by supporting vias.

The interconnect sections of the supporting substructures preferably have a length and a width, the length being greater than the width and the longitudinal orientation of a first interconnect section being parallel to the longitudinal orientation of a second interconnect section formed in an adjacent dielectric layer.

Furthermore, the longitudinal orientation of a first interconnect section can be orthogonal with respect to the longitudinal orientation of a second interconnect section formed in an adjacent dielectric layer.

One or a plurality of interconnect sections of a supporting substructure can preferably be formed as a functional interconnect. The longitudinal orientation of the interconnect sections of adjacent supporting substructures can be oriented both parallel and orthogonally with respect to one another.

The invention is described in more detail below on the basis of preferred exemplary embodiments with reference to the drawings.

Figure 2:
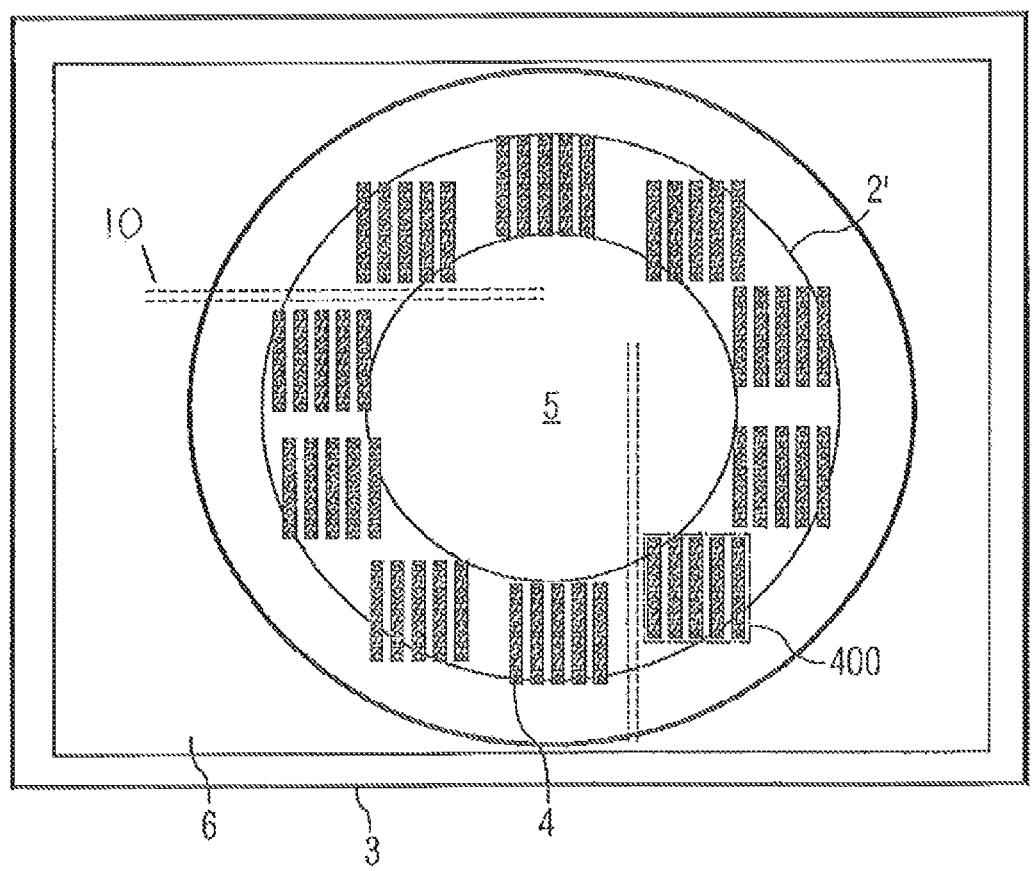
FIG. 2 shows a simplified plan view of the supporting structure within the semiconductor component from FIG. 2 in accordance with one exemplary embodiment.
Figure 3:
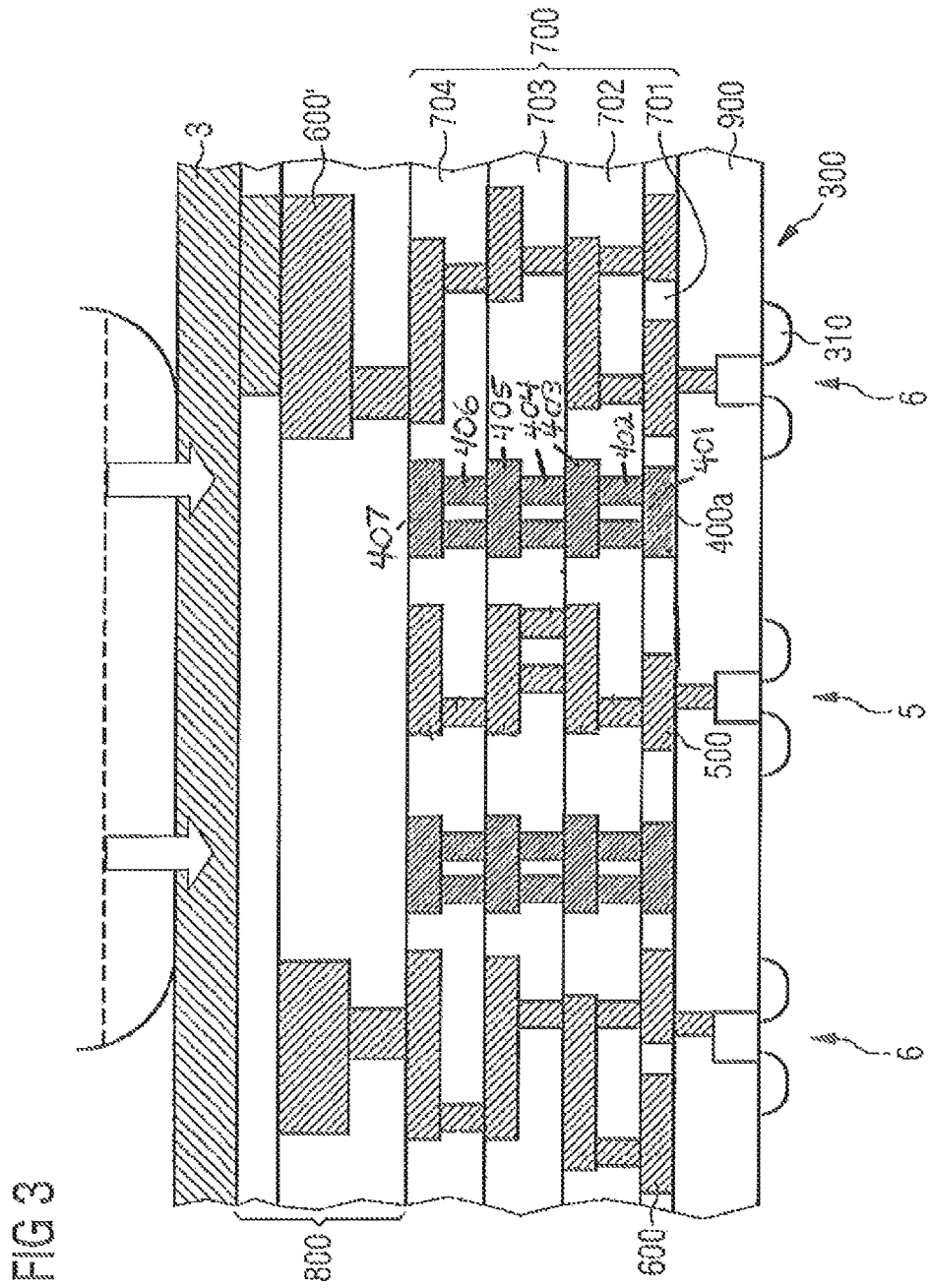
FIG. 3 shows a sectional view of the semiconductor element comprising a supporting structure in accordance with a further exemplary embodiment.
Figure 4:
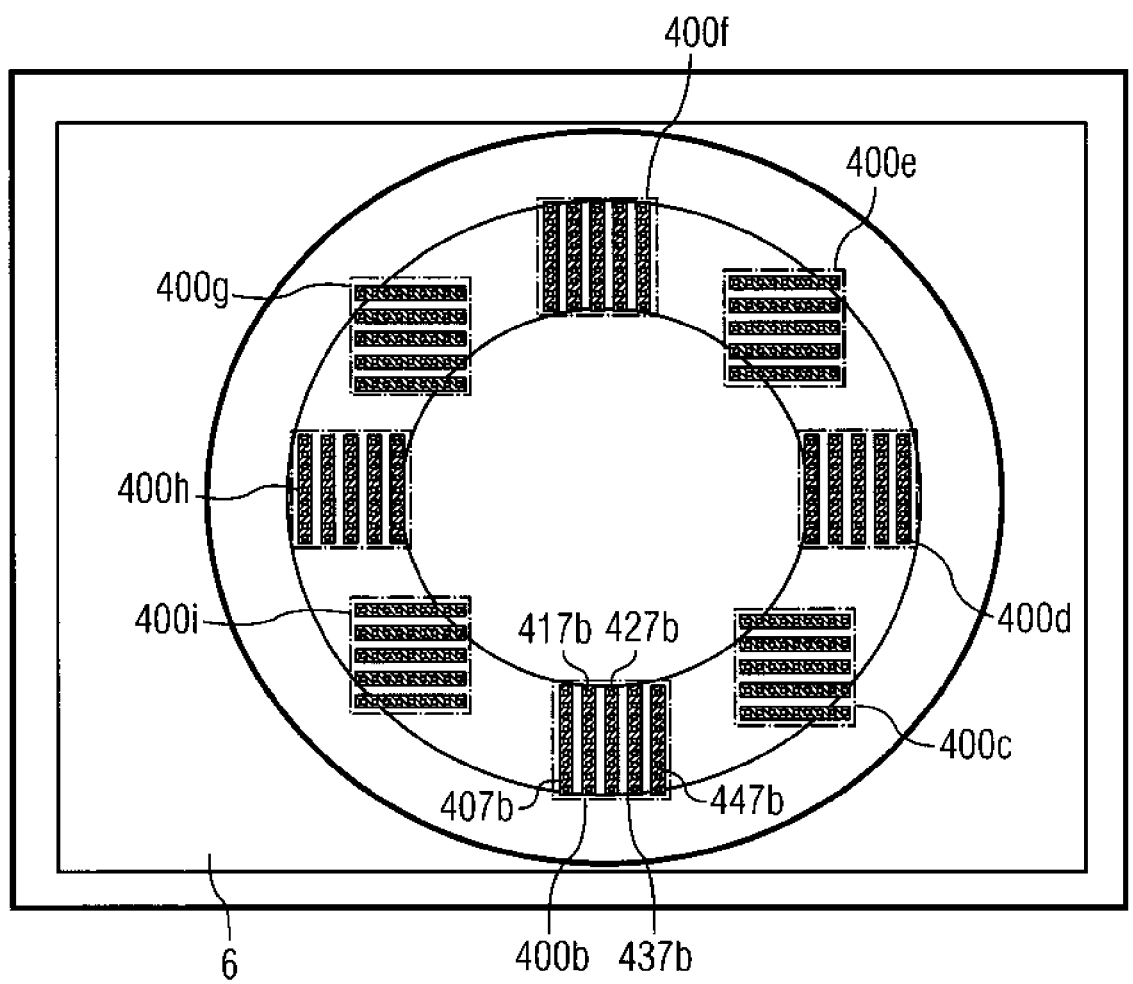
FIG. 4 shows a simplified plan view of the supporting structure within the semiconductor element in accordance with a further exemplary embodiment.
Figure 5:
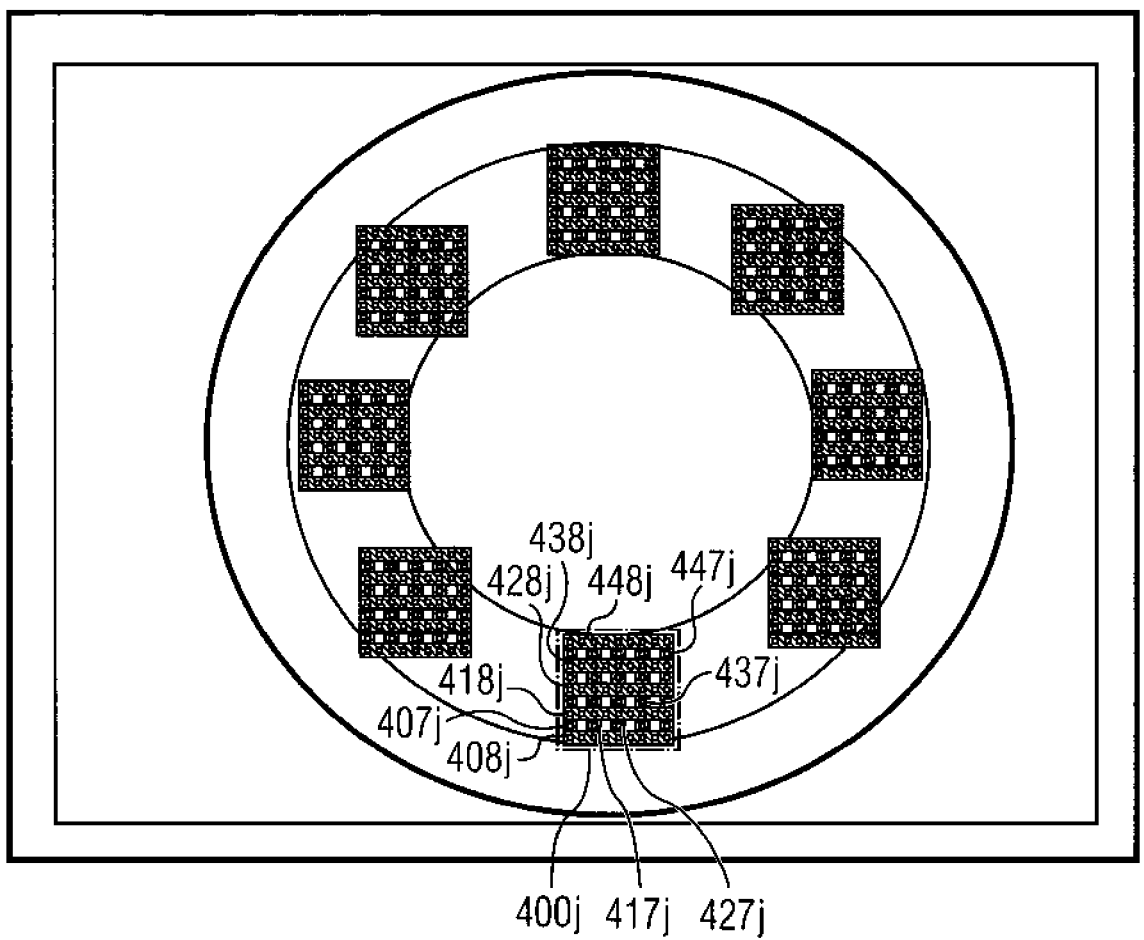
FIG. 5 shows a simplified plan view of the supporting structure within the semiconductor element in accordance with a further exemplary embodiment.

In the figures:

FIG. 1 shows a schematic illustration of the mechanical loadings of a bond during the bonding process in a sectional view, FIG. 2 shows a simplified plan view of the supporting structure within the semiconductor component from FIG. 2 in accordance with one exemplary embodiment, FIG. 3 shows a sectional view of the semiconductor element comprising a supporting structure in accordance with a further exemplary embodiment, FIG. 4 shows a simplified plan view of the supporting structure within the semiconductor element in accordance with a further exemplary embodiment, and FIG. 5 shows a simplified plan view of the supporting structure within the semiconductor element in accordance with a further exemplary embodiment.

FIG. 1 shows a schematic illustration of the mechanical loading of a bond. This is based on a finite-element simulation of the mechanical loadings that occur during the bonding process in the bond. The bond 1 is composed of a wire that is fixedly bonded on the bonding pad by means of a capillary.

The bond has approximately the form of a sphere and is mechanically pressed onto the bonding pad. In this case, the height of the bond decreases and the diameter increases. FIG. 1 shows that the pressure distribution in the bond is not uniform. At the contact area 1 to the bonding pad, the pressure is maximal in a region 2. Region 2 has a round or circular form. In the regions within and outside this pressure region, the loading by pressure is low and mechanical stabilization is not absolutely necessary there. The diameter of the bond at the contact area to the bonding pad may be 40-50 μm. The diameter of the region 2 in which the mechanical loading is maximal may be 20-40 μm. These indications are by way of example and may assume other values depending on the used bonding material, bonding force, bonding temperature, bonding time and diameter of the capillary used.

FIG. 2 shows a simplified plan view of a supporting structure 4 in accordance with a first exemplary embodiment. The supporting structure 4 is formed under a partial region or partial regions of the bonding pad 3. The region 2' in which the supporting structure is formed is essentially round or ring-shaped. Other arrangements or geometrical forms—not illustrated in FIG. 2—of the supporting structure or supporting substructures, such as, for example, triangular, quadrangular or polygonal forms, or else irregular arrangements or forms, are likewise possible. Preferably, the partial region or the partial regions essentially corresponds or correspond to the region of maximal mechanical stress during the bonding process. This is illustrated by way of example for a ring-shaped region 2' in FIG. 2. The diameter of the supporting structure is less than or precisely equal to the diameter of the bond 1 which is applied on the bonding pad. The bond may have e.g. a diameter of 40-50 μm. The diameter of the supporting structure may lie e.g. between 20-40 μm. The supporting structure is preferably formed in such a way that an inner region 5 or outer region 6 without supporting structure or supporting substructures remains, that is to say that alongside the supporting structure there may be an inner region 5 or outer region 6 without supporting structure. The inner region 5 or outer region 6 may be utilized for functional interconnects, capacitances or other active components. By using a supporting structure according to the invention, the inner and outer regions 5, 6 may make up an area of preferably up to 50% of the bonding pad area.

The supporting structure 4 comprises a plurality of supporting substructures 400. The number of these supporting substructures 400 may vary depending on their size and form. A supporting structure comprising just three supporting substructures 400 can be realized just a well as a supporting structure comprising very many more elements or supporting substructures 400 than shown in FIG. 2.

Possible embodiments of the supporting substructure are explained below.

The supporting structure may comprise supporting substructures of identical type, in particular of identical form and size. Equally, however, the supporting structure may also comprise supporting substructures of different types.

An, in particular functional, interconnect 10 is preferably arranged between two adjacent supporting substructures. Functional interconnect should be understood to mean those metallization structures which make electrical contact with semiconductor elements, such as e.g. transistors or diodes. The inner region without supporting structure can be connected to the outer region by the functional interconnect. One or a plurality of supporting substructures can serve as a functional interconnect.

FIG. 3 shows a sectional view of the semiconductor component comprising a supporting structure in accordance with a further exemplary embodiment. The semiconductor component comprises a substrate 300, preferably a silicon semiconductor substrate. As an alternative, it is also possible to use other semiconductor substrates, such as, for example, GaAs, InP, Si/Ge, SiC, or further compound semiconductors. The substrate preferably comprises an integrated circuit 310. The integrated circuit may be arranged outside the bonding pad region or within the bonding pad region. It may comprise further interconnects or semiconductor elements such as e.g. transistors or diodes, which are not illustrated in FIG. 3. The integrated circuit may be for example a memory circuit and also a logic circuit.

The semiconductor component has a first layer sequence 700 comprising a plurality of layers of a first dielectric 701, 702, 703, 704. The first dielectric is preferably a low-k dielectric, that is to say a dielectric having a dielectric constant lower than the dielectric constant of silicon dioxide. The low-k materials furthermore have a low mechanical stability and a low modulus of elasticity. Low modulus of elasticity is understood to be a modulus of elasticity of 20 GPa or less.

A supporting structure 4 is formed within the first layer sequence. The supporting structure 4 is constructed in a manner composed of individual supporting substructures 400a. The supporting structure 4 is preferably formed only under partial regions of the bonding pad 3. An inner region 5 may be utilized for functional interconnects 500, capacitances or other active components. An outer region 6 may likewise be utilized for functional interconnects 600, capacitances or other active components.

The basic vertical construction of the supporting substructure is described by way of example on the basis of the supporting substructure 400a. The supporting substructure 400a is constructed from interconnect sections 401, 403, 405, 407 which are arranged one above another and which are connected to one another by supporting vias 402, 404, 406. The term supporting via should be understood to mean an electrically conductive material that is deposited in a dielectric layer of a semiconductor component and mechanically supports the latter. Supporting vias may preferably also serve for making electrical contact with an overlying or an underlying interconnect. In accordance with one exemplary embodiment, the supporting vias may have a width of 0.05 μm-0.5 μm. In accordance with one exemplary embodiment, the supporting vias may have a width of 0.05 μm-0.2 μm. In accordance with one exemplary embodiment, the supporting vias preferably have a width of 0.2 μm-0.5 μm. In accordance with a further exemplary embodiment, the supporting vias are via bars having different widths and lengths, the length being greater than the width.

The interconnect section 401 in a first layer 701 of the first layer sequence 700 is connected to an overlying interconnect section 403 of a second layer 702 of the first layer sequence 700 by a supporting via 402. The interconnect section 403 of the second layer 702 of the first layer sequence 700 is connected to the overlying interconnect section 405 of a third layer 703 of the first layer sequence 700 by means of a supporting via 404. The interconnect section 405 of the third layer 703 of the first layer sequence 700 is connected to the overlying interconnect section 407 of a fourth layer 704 of the first layer sequence 700 by means of a supporting via 406. Interconnect sections lying one above another can be connected to one another by a single or a plurality of supporting vias.

Preferably, functional interconnect sections 500, 600 are also formed in the layers of the first layer sequence 700. The interconnect sections of the supporting substructures and the functional interconnect sections are preferably produced at the same time.

The supporting substructure 400a is preferably formed in all layers of the first layer sequence 700. In accordance with a further exemplary embodiment, the supporting substructure 400a is formed in all metallization layers of the semiconductor element.

The supporting substructures are preferably produced by a damascene method. This may be either a single-damascene method or a dual-damascene method. Both methods are known to the person skilled in the art, such that a detailed explanation is dispensed with at this point.

A second layer 800 is arranged above the first layer sequence 700. The second layer 800 is preferably composed of a second dielectric having a high modulus of elasticity and has a dielectric constant that is greater than the dielectric constant of a low-k dielectric. The second dielectric layer preferably comprises a layer of an oxide or a layer of a nitride, such as silicon oxide or silicon nitride. As an alternative, the second dielectric layer may also comprise further dielectrics.

The second layer 800 composed of the second dielectric is preferably thicker than one of the layers 701, 702, 703, 704 of the first layer stack 700 composed of the first dielectric. The second layer preferably has a sufficient mechanical stability on account of the material chosen.

A bonding pad 3 is arranged over the second layer. The bonding pad 3 is electrically connected to a functional interconnect 600' of the semiconductor component. A further dielectric layer 900 may be arranged between substrate 300 and first layer stack 700. This further layer preferably comprises a dielectric having a high modulus of elasticity. A supporting structure may also be formed in the further dielectric layer 900. By way of example, the further dielectric layer may comprise a layer of an oxide or a layer of a nitride, such as silicon oxide or silicon nitride.

FIG. 4 shows a simplified plan view of the supporting structure 4 within the semiconductor element in accordance with a further exemplary embodiment. The supporting structure 4 is composed of a plurality of supporting substructures 400b-400i. The basic vertical construction of the supporting substructures is described on the basis of the example of the supporting substructure 400a in FIG. 3. In the horizontal direction, the supporting substructure may comprise just one interconnect section. As an alternative, however, the supporting substructure may also comprise a plurality of interconnect sections, such as e.g. the supporting substructure 400b. In the horizontal direction, a plurality of interconnect sections 407b, 417b, 427b, 437b, 447b are arranged alongside one another. These interconnect sections are formed in the same dielectric layer and have a length 1 and a width b. The width b may assume a value of from 1 to 5 μm, for example, and the length 1 lies within the range of between 5 and 20 μm, for example. However, the length and width of the interconnect sections may also assume other values. The longitudinal orientation of the interconnect sections 407b, 417b, 427b, 437b, 447b along their length 1 is parallel to one another. Interconnect sections of the supporting substructure 400b in overlying or underlying dielectric layers are likewise arranged parallel to one another. The interconnect sections of adjacent dielectric layers are connected to one another by supporting vias.

In accordance with a further exemplary embodiment, a supporting substructure (400c) can also be rotated by 90 degrees in the longitudinal orientation of the interconnect levels. The longitudinal orientation of the supporting substructure 400c is orthogonal with respect to the longitudinal orientation of the supporting substructure 400b. Adjacent supporting substructures can be arranged orthogonally or parallel to one another in terms of their longitudinal orientation. FIG. 4 shows an alternating arrangement of supporting substructures 400b-400i. The supporting substructures 400b, 400d, 400f and 400h and also the supporting substructures 400c, 400e, 400g and 400i have the same number of parallel interconnect sections. The longitudinal orientation of the supporting substructures 400b, 400d, 400f and 400h is orthogonal with respect to the longitudinal orientation of the supporting substructures 400c, 400e, 400g and 400i. This is only one possible embodiment. It is equally possible to realize an arrangement like the one shown in FIG. 2. All of the supporting substructures are preferably identical and have the same longitudinal orientation. Furthermore, an arrangement in which adjacent supporting substructures comprise a different number of adjacent interconnect sections is likewise possible. It is equally possible to realize an arrangement wherein only individual supporting substructures have a longitudinal orientation orthogonal with respect to the longitudinal orientation of other supporting substructures.

FIG. 5 shows a simplified plan view of the supporting structure 4 within the semiconductor element in accordance with a further exemplary embodiment. The supporting substructure 400j comprises a plurality of interconnect sections 407j, 417j, 427j, 437j, 447j in a first dielectric layer. The said interconnect sections are arranged parallel to one another. Further interconnect sections 408j, 418j, 428j, 438j, 448j are arranged in an adjacent second dielectric layer, the said further interconnect sections being arranged orthogonally with respect to the interconnect sections in the first dielectric layer.

Interconnect sections in further dielectric layers may be arranged parallel or orthogonally with respect to the adjacent layers.

The supporting structures and supporting substructure explained are exemplary embodiments and serve to illustrate the invention. Therefore, they should not be understood as restrictive. Rather, a combination of the exemplary embodiments described is obvious to the person skilled in the art.

What is claimed is:

1. A semiconductor component, comprising:
   a supporting structure arranged in a first layer sequence, the first layer sequence comprising a plurality of layers of a low-k dielectric;
   a second layer arranged above the first layer sequence;
   a bonding pad arranged above the second layer, the supporting structure comprising a plurality of supporting substructures and being formed under partial regions of the bonding pad, the supporting substructures being laterally spaced from each other, the supporting substructures arranged in such a way that an inner region and an outer region without the supporting structure remains below the bonding pad, each of the supporting substructures arranged in the same layers of the first layer sequence; and
a functional interconnect arranged between two adjacent laterally spaced supporting substructures, the functional interconnect connecting the inner region to the outer region.

2. The semiconductor component of claim 1, wherein the supporting substructures are arranged in ring-shaped fashion.

3. The semiconductor component of claim 1, wherein the supporting substructures are composed of interconnect sections which are arranged in adjacent dielectric layers of the first layer sequence and are connected to one another by supporting vias.

4. The semiconductor component of claim 3, wherein the interconnect sections have a length and a width, the length being greater than the width and the longitudinal orientation of a first interconnect section being parallel to the longitudinal orientation of a second interconnect section formed in an adjacent dielectric layer.

5. The semiconductor component of claim 3, wherein the interconnect sections have a length and a width, the length being greater than the width and the longitudinal orientation of a first interconnect section being orthogonal with respect to the longitudinal orientation of a second interconnect section formed in an adjacent dielectric layer.

6. The semiconductor component of claim 4, wherein the longitudinal orientation of the interconnect sections of adjacent supporting substructures is parallel with respect to one another.

7. The semiconductor component of claim 4, wherein the longitudinal orientation of the interconnect sections of adjacent supporting substructures is orthogonal with respect to one another.

8. A method of forming a semiconductor component, comprising:
forming a supporting structure arranged in a first layer sequence, the first layer sequence comprising a plurality of layers of a low-k dielectric;
forming a second layer arranged above the first layer sequence;
forming a bonding pad arranged above the second layer, the supporting structure comprising a plurality of supporting substructures and being formed under partial regions of the bonding pad, the supporting substructures being laterally spaced from each other, the supporting substructures arranged in such a way that an inner region and an outer region without the supporting structure remains below the bonding pad, each of the supporting substructures arranged in the same layers of the first layer sequence; and
forming a functional interconnect arranged between two adjacent laterally spaced supporting substructures, the functional interconnect connecting the inner region to the outer region.

9. The semiconductor component of claim 1, wherein the supporting substructures are electrically isolated from each other.

10. The semiconductor component of claim 8, wherein the supporting substructures are electrically isolated from each other.

* * * * *